United States Patent
Chou et al.

(10) Patent No.: US 6,924,238 B2
(45) Date of Patent: Aug. 2, 2005

(54) EDGE PEELING IMPROVEMENT OF LOW-K DIELECTRIC MATERIALS STACK BY ADJUSTING EBR RESISTANCE

(75) Inventors: Tzu-Jen Chou, Hsinchu (TW); Syun-Ming Jang, Hsin-Chu (TW); Ying-Ho Chen, Taipei (TW); Shen-Nan Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/455,037

(22) Filed: Jun. 5, 2003

(65) Prior Publication Data

US 2004/0248426 A1 Dec. 9, 2004

(51) Int. Cl.[7] .............................................. H01L 21/311
(52) U.S. Cl. ....................... 438/699; 438/697; 257/758; 257/760
(58) Field of Search ................................. 438/697, 745, 438/699; 257/759, 760, 758

(56) References Cited

U.S. PATENT DOCUMENTS

| | | | |
|---|---|---|---|
| 5,618,380 A | 4/1997 | Siems et al. ................... 438/14 |
| 5,952,050 A | 9/1999 | Doan .......................... 427/336 |
| 6,057,206 A | 5/2000 | Nguyen et al. .............. 438/401 |
| 6,059,553 A * | 5/2000 | Jin et al. ...................... 427/387 |
| 6,114,747 A * | 9/2000 | Wei et al. .................... 257/620 |
| 6,159,842 A | 12/2000 | Chang et al. |
| 6,239,035 B1 * | 5/2001 | Harris ......................... 438/703 |
| 6,303,899 B1 | 10/2001 | Johnson et al. ......... 219/121.69 |
| 6,472,312 B2 * | 10/2002 | Bao et al. .................... 438/633 |
| 6,492,257 B1 * | 12/2002 | Shields et al. .............. 438/622 |

\* cited by examiner

*Primary Examiner*—Amir Zarabian
*Assistant Examiner*—Christy Novacek
(74) *Attorney, Agent, or Firm*—Haynes and Boone, LLP

(57) ABSTRACT

A new method and structure is provided for the polishing of the surface of a layer of low-k dielectric material. Low-k dielectric material of low density and relatively high porosity is combined with low-k dielectric material of high density and low porosity whereby the latter high density layer is, prior to polishing of the combined layers, deposited over the former low density layer. Polishing of the combined layers removes flaking of the polished low-k layers of dielectric. This method can further be extended by forming conductive interconnects through the layers of dielectric, prior to the layer of dielectric.

20 Claims, 6 Drawing Sheets

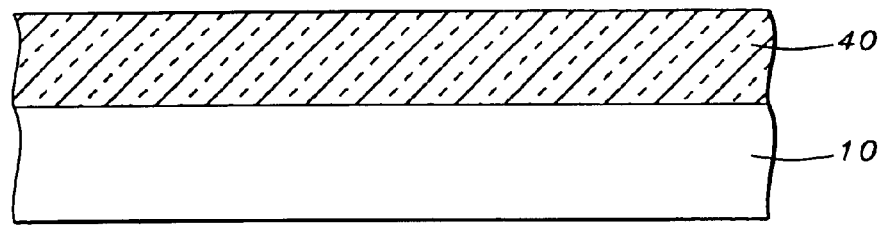
FIG. 8a – Prior Art
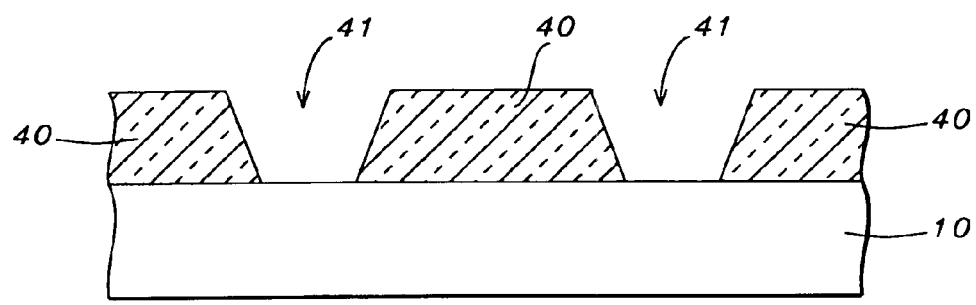
FIG. 8b – Prior Art
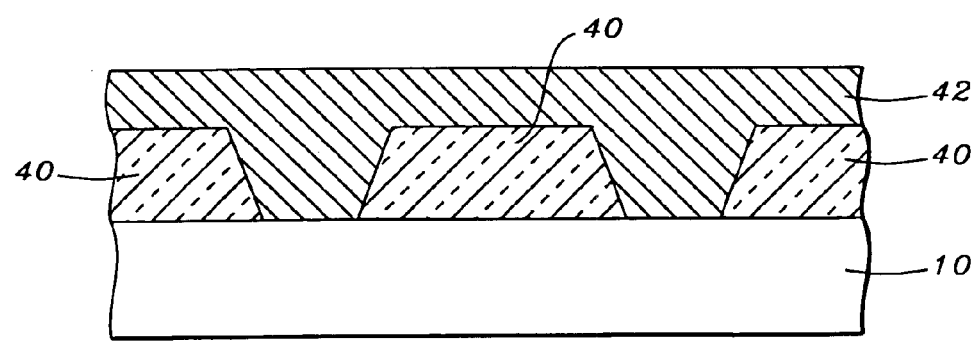
FIG. 8c – Prior Art

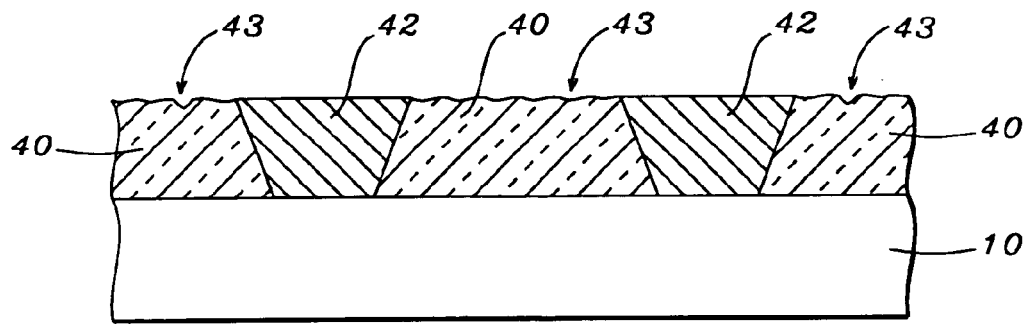
FIG. 8d – Prior Art
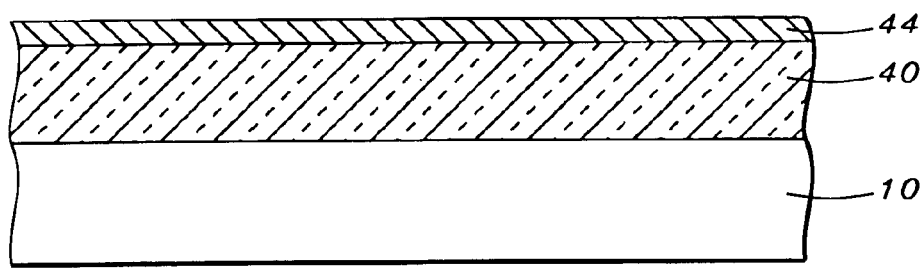
FIG. 9a
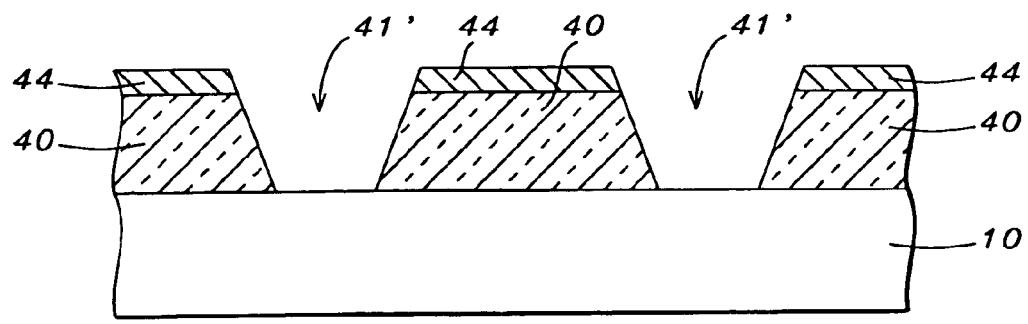
FIG. 9b

EDGE PEELING IMPROVEMENT OF LOW-K DIELECTRIC MATERIALS STACK BY ADJUSTING EBR RESISTANCE

BACKGROUND OF THE INVENTION (1) Field of the Invention

The invention relates to the fabrication of integrated circuit devices, and more particularly, to a method that eliminates edge peeling during Chemical Mechanical Polishing of a layer of low-k dielectric material.

(2) Description of the Prior Art

One of the concerns of creating semiconductor devices relates to the creation or maintenance of good surface planarity of layers of semiconductor material as part of the created semiconductor devices. One of the more frequently applied layers of semiconductor material for the creation of semiconductor devices comprises a dielectric material that typically is used as a layer of insulation between for instance metal interconnects of a semiconductor device.

In fabricating semiconductors, surface planarity of a semiconductor wafer and of thereover deposited layers of semiconductor material must be maintained to meet requirements of optical projection lithography. Good surface planarity is crucial to the lithography process, since consistent and uniform depth of focus of the lithography process cannot be provided for surfaces that do not have good planarity.

A frequently applied method of maintaining or establishing surface planarity is the process of Chemical Mechanical Polishing (CMP) of the surface that is planarized. Chemical Mechanical Polishing is a method of polishing materials, such as semiconductor substrates or layers of dielectric, to a high degree of planarity and uniformity. The process is used to planarize semiconductor slices prior to the fabrication of semiconductor circuitry thereon, and is also used to remove high elevation features created during the fabrication of the microelectronic circuitry over the substrate.

A typical CMP process uses a large polishing pad that is located on a rotating platen against which a substrate is positioned for polishing together with a positioning member, which positions and biases the substrate on the rotating polishing pad. Chemical slurry, which may include abrasive materials, is deposited over the surface of the polishing pad to modify the polishing characteristics of the polishing pad, thereby enhancing the polishing action of the substrate.

In the conventional approach, the wafer is held over a circular carrier, which rotates. The polishing pads, made from a synthetic fabric, are mounted over a polishing platen, which has a flat surface, the polishing platen rotates. The rotating wafer is brought into physical contact with the rotating polishing pad, an action that constitutes the Chemical Mechanical Polishing process. Slurry, which typically includes pH-balanced chemicals, such as sodium hydroxide and silicon dioxide particles, is dispensed onto the polishing pad, typically using a peristaltic pump, excess slurry typically goes to a drain.

Polishing is frequently used in applications where, in applying the CMP process to layers of dielectric material such as Intra-Level Dielectric (ILD) and Inter Metal Dielectric (IMD) that are used for the manufacturing of semiconductor wafers, surface imperfections or micro-scratch present a problem. Imperfections caused by micro-scratches in the ILD and IMD can range from 100 to 1,000 EA for 200 mm wafers, where an imperfection typically has a depth from 500 to 900 $A^0$ and a width of from 1,000 to 3,000 $A^0$.

Of the dielectric materials that are used for the creation of semiconductor devices, low-k dielectrics are preferred since this dielectric provides advantages of device performance. In polishing the surface of a layer of low-k dielectric, it is not uncommon to experience problems of edge peeling of the polished layer, resulting in wafer loss due to the process of CMP. The invention addresses this concern by making use of the observation that dense low-k dielectric material has superior resistance to polishing by CMP than porous (less dense) low-k dielectric. By therefore covering a layer of relatively porous low-k dielectric with a layer of relatively dense low-k dielectric and by polishing the surface of the dense layer of low-k dielectric, the conventional problems of edge peeling encountered when polishing a porous low-k layer of dielectric can be counteracted. It must thereby be appreciated that the terms "porous" and "dense" are relative to each other.

U.S. Pat. No. 5,618,380 (Siems et al.) shows a wafer edge sealing process.

U.S. Pat. No. 5,952,050 (Doan) shows a method to remove material from the wafer edge.

U.S. Pat. No. 6,303,899 B1 (Johnson et al.) and U.S. Pat. No. 6,057,206 (Nguyen et al.) are related patents.

SUMMARY OF THE INVENTION

A principle objective of the invention is to provide a method of polishing the surface of a layer of low-k dielectric whereby edge peeling of the polished wafer is removed as a yield detractor.

Another objective of the invention is to provide, without requiring additional steps of wafer or semiconductor processing, a method of polishing the surface of a layer of low-k dielectric whereby edge peeling of the polished wafer is removed as a yield detractor.

A new method and structure is provided for the polishing of the surface of a layer of low-k dielectric material. Low-k dielectric material of low density and relatively high porosity is combined with low-k dielectric material of high density and low porosity whereby the latter high density layer is, prior to polishing of the combined layers, deposited over the former low density layer. Polishing of the combined layers removes flaking of the polished low-k layers of dielectric. This method can further be extended by forming conductive interconnects through the layers of dielectric prior to polishing the layer of dielectric.

BRIEF DESCRIPTION OF THE DRAWINGS

FIGS. 8a–8d and 9a–9d, further explain the invention's integration of dense and porous low-k dielectric materials with conductive layers, whereby FIGS. 8a–8d relate to prior art application of low-k porous dielectric material while FIGS. 9a–9d relate to the invention's application of dense and porous low-k dielectric material.

DESCRIPTION OF THE PREFERRED EMBODIMENTS

In conventional processing, low-k dielectric materials having high surface hardness may be used to cover a layer of Inter Metal Dielectric (IMD). This is known to lead to a level of concentration of dielectric material around the perimeter of the low-k dielectric material that is unacceptable. Edge Bead Remove (EBR) is one technique that is applied to counteract this high level of concentration around the perimeter of a layer of low-k dielectric material, a level that may contribute to peeling of the layer of low-k dielectric around the perimeter of this layer. Excessive EBR around the perimeter of a layer of low-k dielectric material must be prevented, which is one of the options that are available in polishing the surface of a layer of low-k dielectric material.

The invention is now explained in detail using FIGS. 1 through 7 for this purpose. It has previously been stated that the invention provides a method of preventing peeling of a polished layer of low-k dielectric by combining low-k porous layers of dielectric with low-k dense layers of dielectric. This will become more apparent during the following explanation of the invention.

Figure 1:
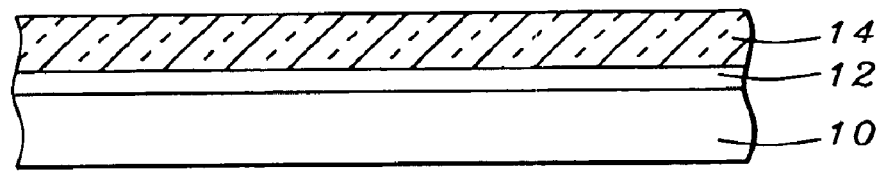
FIG. 1 is the cross section of the surface of a substrate over the surface of which have been deposited an (optional) layer of etch stop material and a layer of porous low-k dielectric.

Referring now specifically to FIG. 1, there is shown a cross section of a semiconductor substrate 10 over the surface of which an optional layer 12 of etch stop material has been deposited after which a layer 14 of porous low-k dielectric is deposited over the surface of the optional layer 12 of etch stop material.

As examples of silicate based low-k dielectric constant materials can be cited hydrogen silsesquioxane and HbP-FSG (high-density-plasma fluorine-doped silicate glass), carbon doped silicates, spin-on low-k materials and polymeric materials. Low-k polymer materials include polyimides, fluorinated polyimides, polysilsequioxane, benzocyclobutene (BCB), parlene F, parlene N and amorphous polytetrafluorothylene.

Materials that can be used as layers of dielectric and the therewith associated dielectric constants can be cited as examples:

| Inorganics | |
| --- | --- |
| Plasma $SiO_2$ | 4.1–4.5 |
| Fluorine doped $SiO_2$ (FSG) | 3.5 |
| Glass (FSG) | 3.0–3.7 |
| Organics | |
| Polysilsequioxane (Si polymer) | 2.7–3.0 |
| Bemzocyclobutene (BCB) | 2.7 |
| Parylene N | 2.7 |
| Fluorinated polyimide | 2.5 |
| Parylene F | 2.3 |
| Amorphous teflon | 1.9 |

It is thereby well known in the art that low-k dielectric materials, such as amorphous teflon or parylene F, typically have a porous, low density structure. By combining these layers of porous material with layers of dielectric having a dense structure, typical effects of edge peeling of low-k dielectric layers during processes of CMP are eliminated.

Figure 2:
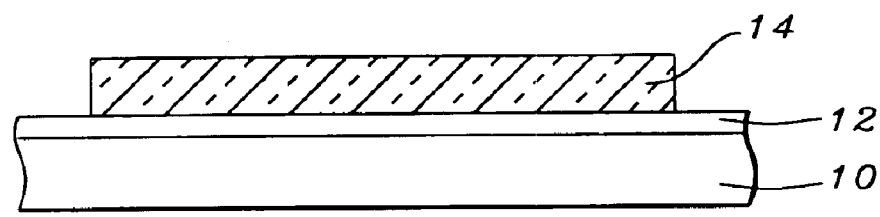
FIG. 2 is a cross section after the layer of porous low-k dielectric has been patterned and etched, removing the low-k dielectric material from the perimeter of the substrate.

To counteract the occurrence of excessive concentration of dielectric material around the perimeter of the substrate 10, the step of EBR may be optionally applied as shown in the cross section of FIG. 2. The layer 14 of low-k dielectric is thereby removed at the edges of this layer 14, where the layer 14 approaches the perimeter of the substrate 10.

Figure 3:
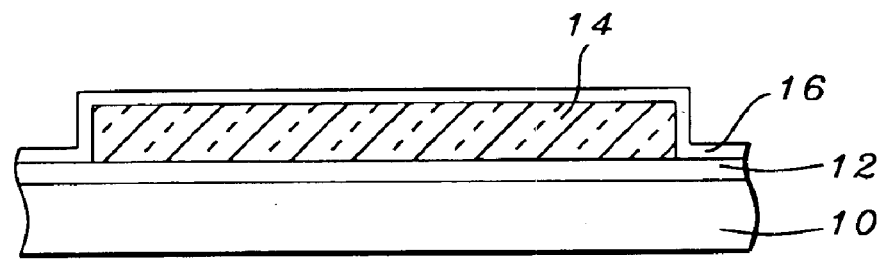
FIG. 3 shows a cross section after a layer of dense low-k dielectric has been deposited.

The invention proceeds, FIG. 3, with the deposition of a layer 16 of low-k, dense dielectric material over the surface of the low-k porous layer 14 of dielectric material.

The thickness of the layers that have been discussed up to this point is design dependent and will therefore not be specified. In addition, the parameter of layer thickness adheres under the invention to conventional considerations of layer deposition as part of the creation of a semiconductor device. Similar considerations apply to the processing conditions that are required for the creation of the various layers, leading to similar conclusion of not specifying these processing conditions at this time. These parameters are, in addition, not germane to the invention.

It stands to reason that for instance the thicknesses of overlying layers of low-k porous dielectric material and low-k dense dielectric material may be mutually dependent and that for instance a relatively thick layer of porous dielectric material requires a relatively thick layer of dense dielectric material. The thickness of the dense layer of dielectric material must thereby, for a given thickness of the porous underlying layer of dielectric material, be determined and controlled such that the phenomenon of peeling of the combined layers is eliminated or brought within acceptable limits of substrate yield loss.

In addition, the various parameters of thickness of deposition and the like are dependent on the material that is selected for both the low density, porous layer of dielectric and the therewith applied dense layer of low-k dielectric. This further negates the need or desirability of quoting specific values for these parameters of layer thickness and the like.

Figure 4:
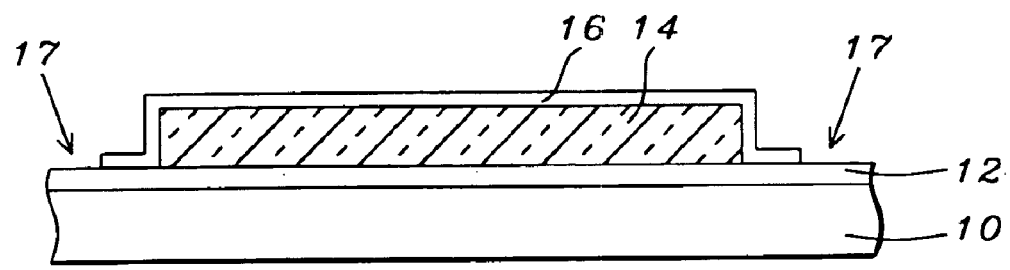
FIG. 4 shows a cross section after the layer of dense low-k dielectric material has been removed from the perimeter of the substrate.

To the deposited layer 16 of low-k, dense dielectric material may again and optionally be applied EBR control, as shown in the cross section of FIG. 4 where layer 16 has been removed from above surface areas 17 of layer 12.

The essential aspects of the invention that have been highlighted above can be summarized as follows:

The structural combination of porous low-k dielectric material combined with dense, low-k dielectric material is basic to the invention, and Edge Bead Remove (EBR) may optionally be applied to either the porous low-k dielectric material or to the dense low-k dielectric material or to any combination thereof.

The advantages that are gained by using the invention can be summarized as follows:

Film properties of created layers of dielectric are enhanced, such as mechanical strength of the created dielectric layer, adhesion between adjacent and overlying layers such as layers of Anti Reflective Coating, resistance to moisture penetration and resistance to penetration by surrounding and contacting chemicals The problem of edge peeling of a stack of porous layers of dielectric has been eliminated, and No additional processing steps are required for the implementation of the invention.

The use of EBR for the creation of a stack of overlying layers of dielectric material can further by highlighted as follows whereby the porosity of the low-k dielectric layer is the controlling parameter.

Figure 5:
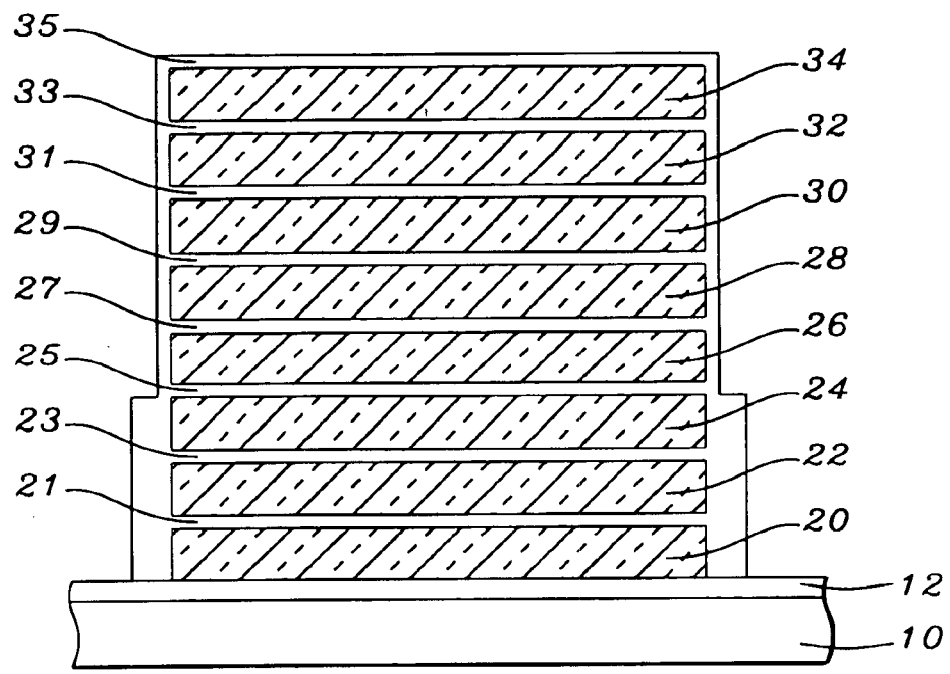
FIGS. 5 through 7 show cross sections of depositions of multiply layers of porous and dense layers of low-k dielectric, whereby perimeter etching of the deposited layers is determined by the relative porosity of the low-k porous layers of low-k dielectric when compared with the dense layers of low-k dielectric.

FIG. 5 shows a stack of layers of porous, low-k dielectric material highlighted as layers 20, 22, 24, 26, 28, 30, 32 and 34. Overlying these porous low-k dielectric layers are layers of dense low-k dielectric material highlighted as layer 21, 23, 25, 27, 29, 31, 33 and 35 while layer 12 is the previously discussed layer of etch stop material that may optionally be deposited over the surface of substrate 10.

For the cross section that is shown in FIG. 5, EBR has first been applied to a first EBR parameter after layers 20–24 have been deposited after which EBR has second been applied to a second EBR parameter for layers 25–35.

This pattern of EBR control is preferably applied for layers 20, 22, 24, 26, 28, 30, 32 and 34 of porous low-k dielectric material that have high porosity and that therefore must be maximally supported to prevent peeling and to provide the additional, above listed advantages of film creation.

Figure 6:
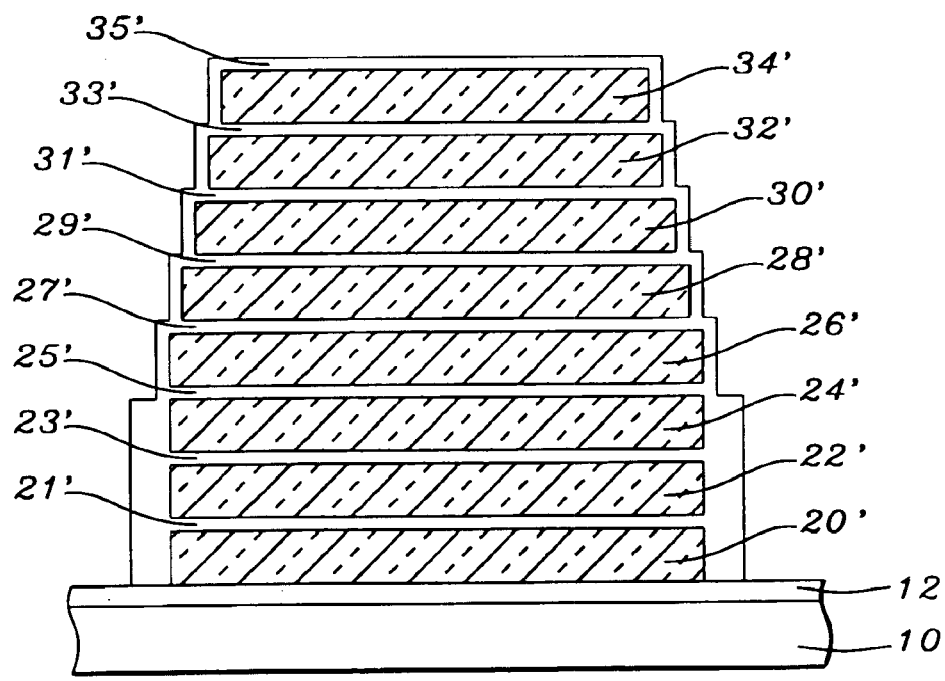
Figure 7:
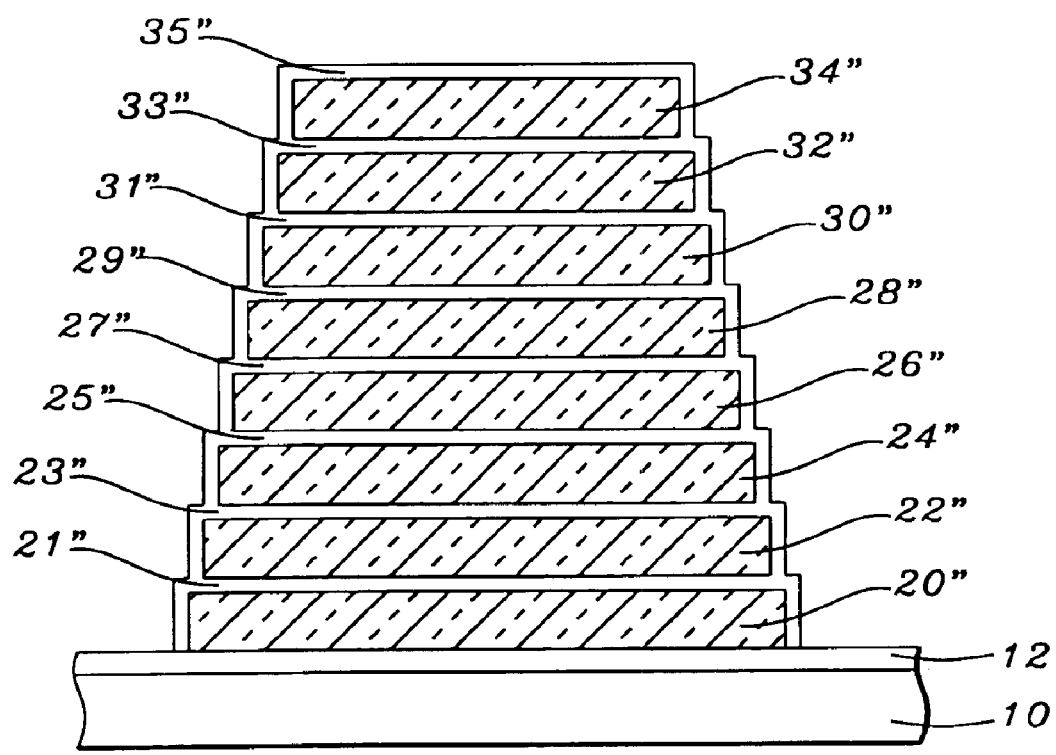

FIGS. 6 and 7 show further extensions of the invention whereby FIG. 6 is representative of layers 20', 22', 24', 26', 28', 30', 32' and 34' as comprising medium porosity low-k dielectric material while FIG. 7 is representative of layers 20", 22", 24", 26", 28", 30", 32" and 34" as comprising low porosity low-k dielectric material.

For the cross section shown in FIG. 6, the EBR control is adjusted so that adequate support is provided for the medium porous layers 20', 22', 24', 26', 28', 30', 32' and 34' by the overlying layers 21', 23', 25', 27', 29', 31', 33' and 35' of dense low-k dielectric material. Since layers 20', 22', 24', 26', 28', 30', 32' and 34' are of medium porosity, these layers need more "support" than the layers 20, 22, 24, 26, 28, 30, 32 and 34 of FIG. 5 and must therefore be more aggressively removed from the perimeter of these layers, resulting in an increased number (of five shown in FIG. 6) of EBR control parameters, progressively reducing the surface of the remaining layers of dielectric as the upper layer 34' is approached.

The same reasoning as has been applied above for the creation of the cross section that is shown in FIG. 6 applies to the cross section that is shown in FIG. 7. Since the layers 20", 22", 24", 26", 28", 30", 32" and 34" comprise a low porosity low-k dielectric material, the EBR control must be more aggressively applied, resulting in a total of eight EBR control parameters as shown in FIG. 7, yet further progressively reducing the surface of the remaining layers of dielectric as the upper layer 34" is approached. In addition, EBR is also applied to the layers 20", 22", 24", 26", 28", 30", 32" and 34" to further enhance the improvement characteristics that are obtained by combining dense with porous layers of dielectric material. Since thereby the layers 20", 22", 24", 26", 28", 30", 32" and 34" comprise a low porous dielectric material, these layers must be removed applying EBR at lower levels such as layer 22" and continuing up through layer 34".

From the cross sections that are shown in FIGS. 5 through 7, it is clear that, as the porosity of the low-k dielectric layers of a stack decreases, EBR control of the perimeter must be more aggressively applied and the overlying layers of low porosity dielectric must be additionally removed from the perimeter of these layers.

The invention's integration of dense and porous low-k dielectric materials with conductive layers is further explained using FIGS. 8a–8d and 9a–9d, whereby FIGS. 8a–8d relate to prior art application while FIGS. 9a–9d relate to the application of dense and porous low-k dielectrics as provided by the invention.

Referring first specifically to FIGS. 8a–8d, there is shown a cross section of a semiconductor surface, preferable the surface of a silicon substrate, over which a layer 40 of porous, low-k dielectric has been deposited. Openings 41, FIG. 8b, are created through layer 40 of porous, low-k dielectric for the formation of conductive interconnects therein. A layer 42, FIG. 8c, of conductive material, preferably comprising metal, is deposited over porous low-k dielectric layer 40, filling openings 41 and overlying layer 40. To complete the creation of conductive interconnects through layer 40, layer 42 is removed from layer 40 of low-k porous dielectric material, as shown in the cross section of FIG. 8d, preferably applying methods of Chemical Mechanical Polishing (CMP).

In applying this basic and conventional method of creating conductive interconnects through a layer 40 of low-k porous dielectric as shown in the cross sections of FIGS. 8a–8d, the polishing action of removing layer 42 from layer 40 stops on the surface of layer 40 of low-k porous dielectric material. At the time that this interfacing between the polishing pad (not shown) and the surface of layer 40 occurs, the surface of layer 40 tends to peel due to the interaction between the polishing pad and the low-k porous dielectric material of layer 40, resulting in a rough or uneven surface 43 of layer 40.

Figure 9C:
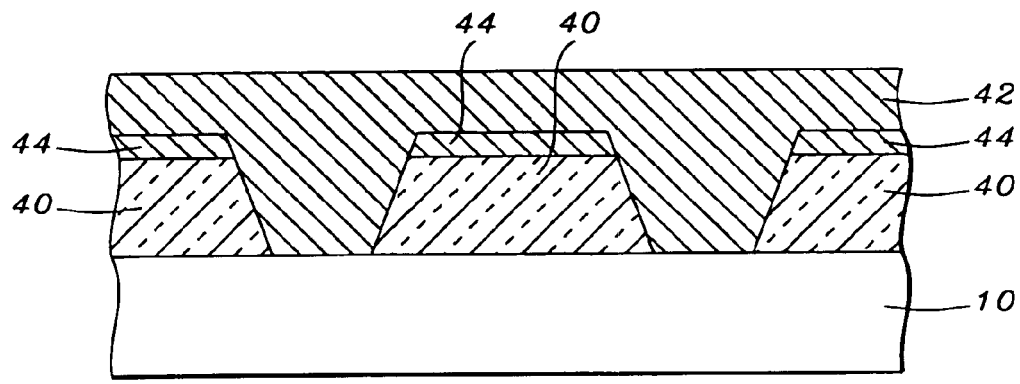
Figure 9D:
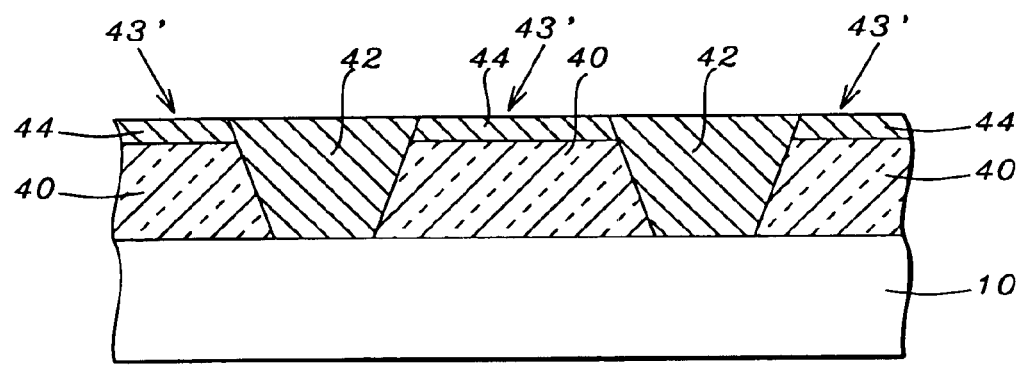

To prevent the roughness 43 of the surface of layer 40, the invention provides for a layer 44, FIG. 9a, of low-k, dense dielectric material that is deposited over the conventional layer 40 of low-k porous dielectric material. Openings 41', FIG. 9b, are created through layers 44 and 40, the layer 42 of conductive material is deposited, FIG. 9c and polished, FIG. 9d.

The polishing of layer 42, FIG. 9c, now stops on the surface of the low-k, dense layer 44 of dielectric material. Since this stop layer 44 is a dense dielectric material, no peeling of the surface of layer 44 occurs, resulting in a smooth and planar surface 43' of the layer 44 as shown in the cross section of FIG. 9d. The combined layers 40/42, FIG. 9d, form the Intra Level Dielectric (ILD) for conductive interconnects 42.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

The invention, which provides a method for forming a dielectric layer, can be summarized as follows:

providing a semiconductor substrate depositing a layer of etch stop material over the substrate depositing at least one stack of layers of dielectric material over the substrate, the at least one stack comprising:
  (i) a first layer of low-k dielectric material; and
  (ii) a second layer of low-k dielectric material over the first layer of low-k dielectric material, whereby the second layer of low-k dielectric material is more dense than the first layer of low-k dielectric material polishing the at least one stack of layers of dielectric material using CMP, and additionally applying Edge Bead Remove (ERR) to the first layer of low-k dielectric material, removing the first layer of low-k dielectric material over a distance from a perimeter of the substrate determined by a density of the low-k dielectric material, with denser low-k dielectric material being removed over a larger distance.

Alternately, the invention which provides a method for forming a dielectric layer, can be summarized as follows:

providing a semiconductor substrate depositing a multiplicity of first layers of low-k dielectric material over the substrate depositing a multiplicity of second layers of low-k dielectric material over layers pertaining to the multiplicity of first layers of low-k dielectric material, whereby the second layers of low-k dielectric material are more dense than the first layers of low-k dielectric material polishing the multiplicity of second layers of low-k dielectric material using CMP additionally depositing a layer of etch stop material over the substrate, the additional step being performed prior to the step of depositing the multiplicity of first layers of low-k dielectric material over the substrate additionally applying Edge Bead Remove (EBR) to the multiplicity of first layers of low-k dielectric material, removing the first layers of low-k dielectric material over a distance from a perimeter of the substrate determined by a density of the first layers of low-k dielectric material, with denser low-k dielectric material being removed over a larger distance the additionally applying Edge Bead Remove to the multiplicity of first layers of low-k dielectric material being applied in increasing frequency while removing increasing edge regions of the multiplicity of first layers of low-k dielectric material as density of layers of the multiplicity of first layers of low-k dielectric material increases with respect to density of layers of the multiplicity of second layers of low-k dielectric material.

Alternately yet, the invention which provides a method for forming a dielectric layer, can be summarized as follows:

providing a semiconductor substrate depositing a layer of etch stop material over the substrate depositing a multiplicity of first layers of low-k dielectric material over the layer of etch stop material applying Edge Bead Remove (EBR) to the multiplicity of first layers of low-k dielectric material, removing the first layers of low-k dielectric material over a distance from a perimeter of the substrate determined by a density of the first layers of low-k dielectric material, with denser low-k dielectric material being removed over a larger distance depositing a multiplicity of second layers of low-k dielectric material over layers pertaining to the multiplicity of first layers of low-k dielectric material whereby the second layers of low-k dielectric material are more dense than the first layers of low-k dielectric material polishing the multiplicity of second layers of dense low-k dielectric material using CMP the applying Edge Bead Remove to the multiplicity of first layers of low-k dielectric material being applied in increasing frequency while removing increasing edge regions of the multiplicity of first layers of low-k dielectric material as a density of the multiplicity of first layers of low-k dielectric material increases with respect to density of the multiplicity of second layers of low-k dielectric material.

What is claimed is:

1. A method for forming a dielectric layer, comprising the steps of:

providing a semiconductor substrate;

forming a first layer of low-k dielectric material over the substrate;

applying Edge Bead Remove (EBR) to said first layer of low-k dielectric material, removing said low-k dielectric over a distance from a perimeter of said substrate determined by a density of said low-k dielectric, with denser low-k dielectric material being removed over a larger distance;

forming at least one second layer of low-k dielectric material over said first layer of low-k dielectric material whereby said at least one second layer of low-k dielectric is more dense than said first layer of low-k dielectric; and polishing said at least one second layer low-k dielectric material using CMP.

2. The method of claim 1, additionally depositing a layer of etch stop material over said substrate, said additional step being performed prior to said step of forming a first layer of low-k dielectric material over said substrate.

3. The method of claim 1, additionally applying Edge Bead Remove (EBR) to said first layer of low-k dielectric material.

4. The method of claim 1 wherein at least one of said first and second layers of low-k dielectric material is hydrogen silsesquioxane, HDP-FSG (high-density-plasma fluorine-doped silicate glass), carbon doped silicates, spin-on low-k materials or polymeric materials, the latter including polyimides, fluorinated polyimides, polysilsequioxane, benzocyclobutene (BCB), parlene F, parlene N and amorphous polytetrafluorothylene.

5. A method for forming a dielectric layer, comprising the steps of:

providing a semiconductor substrate;

forming a first layer of low-k dielectric material over the substrate;

applying Edge Bead Remove (EBR) to said first layer of low-k dielectric material, removing said low-k dielectric over a distance from a perimeter of said substrate determined by a density of said low-k dielectric, with denser low-k dielectric material being removed over a larger distance;

forming at least one second layer of low-k dielectric material over said first layer of low-k dielectric material whereby said at least one second layer of low-k dielectric is more dense than said first layer of low-k dielectric;

applying Edge Bead Remove (EBR) to said at least one second layer of low-k dielectric material; and polishing said at least one second layer low-k dielectric material using CMP.

6. A method for forming a dielectric layer, comprising the steps of:

providing a semiconductor substrate;

depositing a layer of etch stop material over said substrate;

depositing at least one stack of layers of dielectric material over the substrate, said at least one stack comprising:

(i) a first layer of low-k dielectric material; and (ii) a second layer of low-k dielectric material over said first layer of low-k dielectric material, whereby said second layer of low-k dielectric is more dense than said first layer of low-k dielectric;

applying Edge Bead Remove (EBR) to said first layer of low-k dielectric material, removing said first layer of low-k dielectric over a distance from a perimeter of said substrate determined by a density of said first layer of low-k dielectric, with denser low-k dielectric material being removed over a larger distance; and polishing said at least one stack of layers of dielectric material using CMP.

7. A method for forming a dielectric layer, comprising the steps of:

providing a semiconductor substrate;

depositing a layer of etch stop material over said substrate;

depositing at least one first layer of low-k dielectric material over said layer of etch stop material;

applying Edge Bead Remove (EBR) to said at least one first layer of low-k dielectric material, removing said at least one low-k dielectric over a distance from a perimeter of said substrate determined by a density of said low-k dielectric, with denser low-k dielectric material being removed over a larger distance;

depositing at least one second layer of low-k dielectric material over said at least one first layer of low-k dielectric material, whereby said at least one second layer of low-k dielectric is more dense than said at least one first layer of low-k dielectric; and polishing said at least one second layer of low-k dielectric material using CMP.

8. The method of claim 7 wherein at least one of said first and second layers of low-k dielectric material is hydrogen silsesquioxane, HDP-FSG (high-density-plasma fluorine-doped silicate glass), carbon doped silicates, spin-on low-k materials or polymeric materials, the latter including polyimides, fluorinated polyimides, polysilsequioxane, benzocyclobutene (BCB), parlene F, parlene N and amorphous polytetrafluorothylene.

9. A method for forming a dielectric layer, comprising the steps of:

providing a semiconductor substrate;

depositing a multiplicity of first layers of low-k dielectric material over said substrate;

depositing a multiplicity of second layers of low-k dielectric material over layers pertaining to said multiplicity of first layers of low-k dielectric material, whereby said multiplicity of second layers of low-k dielectric material are more dense than said multiplicity of first layers of low-k dielectric material;

applying Edge Bead Remove (EBR) to said multiplicity of first layers of low-k dielectric material, removing said multiplicity of first layers of low-k dielectric material over a distance from a perimeter of said substrate determined by a density of said multiplicity of first layers of low-k dielectric material, with denser first layers of low-k dielectric material being removed over a larger distance; and polishing said multiplicity of second layers of low-k dielectric material using CMP.

10. The method of claim 9, said additionally applying Edge Bead Remove to said multiplicity of first layers of low-k dielectric material being applied in increasing frequency while removing increasing edge regions of said multiplicity of first layers of low-k dielectric material as density of said layers of said multiplicity of first layers of low-k dielectric material increases with respect to density of layers of said multiplicity of second layers of low-k dielectric material.

11. A method for forming a dielectric layer, comprising the steps of:

providing a semiconductor substrate;

depositing a layer of etch stop material over said substrate;

depositing a multiplicity of first layers of low-k dielectric material over said layer of etch stop material;

applying Edge Bead Remove (EBR) to said multiplicity of first layers of low-k dielectric material, removing said multiplicity of first layers of low-k dielectric material over a distance from a perimeter of said substrate determined by a density of said multiplicity of first layers of low-k dielectric material, with higher density first layers of low-k dielectric material being removed over a larger distance;

depositing a multiplicity of second layers of low-k dielectric material over layers pertaining to said multiplicity of first layers of low-k dielectric material whereby said multiplicity of second layers of low-k dielectric material are more dense than said multiplicity of first layers of low-k dielectric material; and polishing said multiplicity of second layers of low-k dielectric material using CMP.

12. The method of claim 11, said applying Edge Bead Remove to said multiplicity of first layers of low-k dielectric material being applied in increasing frequency while removing increasing edge regions of said multiplicity of first layers of low-k dielectric material as a density of said multiplicity of first layers of low-k dielectric material increases with respect to density of said multiplicity of second layers of low-k dielectric material.

13. A method for forming a dielectric layer, comprising the steps of:

providing a semiconductor substrate;

depositing at least one composite layer of low-k dielectric material over said substrate, said at least one layer of composite low-k dielectric material comprising:

(i) at least one first layer of low-k dielectric material over said substrate; and (ii) at least one second layer of low-k dielectric material over said at least one first layer of layer of porous low-k dielectric material whereby said at least one second layer of low-k dielectric is more dense than said at least one first layer of low-k dielectric;

applying Edge Bead Remove (EBR) to said at least one first layer of low-k dielectric material, removing said at least one first layer of low-k dielectric material over a distance from a perimeter of said substrate determined by a density of said at least one first layer of low-k dielectric material, with denser first layers of low-k dielectric material being removed over a larger distance; and polishing said at least one composite layer of low-k dielectric material using CMP.

14. A method for forming a dielectric layer, comprising the steps of:

providing a semiconductor substrate;

depositing a layer of etch stop material over said substrate;

depositing at least one composite layer of low-k dielectric material over said substrate, said at least one composite layer of low-k dielectric material comprising:

(i) at least one first layer of low-k dielectric material over said layer of etch stop material;

(ii) at least one second layer of low-k dielectric material over said at least one first layer of low-k dielectric material whereby said at least one second layer of low-k dielectric material is more dense than said at least one first layer of low-k dielectric material;

applying Edge Bead Remove (EBR) to said at least one first layer of low-k dielectric material, removing said at least one first layer of low-k dielectric material over a distance from a perimeter of said substrate determined by a density of said first layer of low-k dielectric material, with denser first layers of low-k dielectric material being removed over a larger distance; and polishing said at least one second layer of low-k dielectric material using CMP.

15. The method of claim 14, additionally applying Edge Bead Remove (EBR) to said at least one second layer of low-k dielectric material.

16. A The method of claim 14 wherein at least one of said first and second layers of low-k dielectric material is hydrogen silsesquioxane, HDP-FSG (high-density-plasma fluorine-doped silicate glass), carbon doped silicates, spin-on low-k materials or polymeric materials, the latter including polyimides, fluorinated polyimides, polysilsequioxane, benzocyclobutene (BCB), parlene F, parlene N and amorphous polytetrafluorothylene.

17. A semiconductor structure created over a substrate, comprising:

a semiconductor substrate;

a layer of etch stop material having been deposited over said substrate;

at least one composite layer of low-k dielectric material having been deposited over said substrate, said at least one composite layer of low-k dielectric material comprising:

(i) at least one first layer of low-k dielectric material over said layer of etch stop material;

(ii) at least one second layer of low-k dielectric material over said at least one first layer of low-k dielectric material whereby said at least one second layer of low-k dielectric material is more dense than said at least one first layers of low-k dielectric material;

Edge Bead Remove (EBR) having been applied to said at least one first layer of low-k dielectric material, said at least one first layer of low-k dielectric material having been removed over a distance from a perimeter of aid substrate determined by a density of said at least one first layer of low-k dielectric material, with denser low-k dielectric material being removed over a larger distance; and Edge Bead Remove (EBR) having been applied to said at least one second layer of low-k dielectric material; and said at least one second layer of low-k dielectric material having been polished using CMP.

18. A method of forming conductive interconnects, comprising:

providing a semiconductor substrate;

forming a first layer of low-k dielectric material over the substrate;

forming a second layer of low-k dielectric material over said first layer of low-k dielectric material whereby said second layer of low-k dielectric material is more dense than said first layer of low-k dielectric material;

pattering said first and second layer of low-k dielectric material, creating at least one opening there-through;

applying Edge Bead Remove (EBR) to said second layer of low-k dielectric material;

depositing a layer of conductive material over said second layer of low-k dielectric material, filling said at least one opening therewith; and removing said layer of conductive material from said second layer of low-k dielectric material, using CMP.

19. A method of forming conductive interconnects, comprising:

providing a semiconductor substrate;

depositing a layer of etch stop material over said substrate;

depositing at least one stack of layers of dielectric material over the substrate, said at least one stack comprising:

(i) a first layer of low-k dielectric material; and (ii) a second layer of low-k dielectric material over said first layer of low-k dielectric material, whereby said second layer of low-k dielectric material is more dense than first layer of low-k dielectric material;

applying Edge Bead Remove (EBR) to said first layer of low-k dielectric material, removing said first layer of low-k dielectric material over a distance from a perimeter of said substrate determined by a density of said first layer of low-k dielectric material, with denser first layers of low-k dielectric material being removed over a larger distance;

pattern said at least one stack of layers of dielectric material, creating at least one opening there-through;

depositing a layer of conductive material over said at least one stack of layers of dielectric material, filling said at least one opening there-with; and removing said layer of conductive material from said at least one stack of layers of dielectric material, using CMP.

20. A structure of conductive interconnects, comprising:

a semiconductor substrate;

a first layer of low-k dielectric material over the substrate;

a second layer of low-k dielectric material over said first layer of low-k dielectric material whereby said second layer of low-k dielectric material is more dense than said first layer of low-k dielectric material wherein Edge Bead Remove (EBR) has been applied to said second layer of low-k dielectric material, at least one opening created through said first and said second layer of low-k dielectric material; and said at least one opening having been filled with a layer of conductive material.

* * * * *